(12) United States Patent
Kim et al.

(10) Patent No.: US 12,250,840 B2
(45) Date of Patent: Mar. 11, 2025

(54) UNIT PIXEL FOR RED-GREEN-CYAN-BLUE (RGCB) MICRO-DISPLAY HAVING VERTICALLY STACKED SUB-PIXELS

(71) Applicant: SUNDIODE KOREA, Seoul (KR)

(72) Inventors: James Chinmo Kim, Mountain View, CA (US); Sungsoo Yi, Sunnyvale, CA (US)

(73) Assignee: SUNDIODE KOREA (KR)

( * ) Notice: Subject to any disclaimer, the term of this patent is extended or adjusted under 35 U.S.C. 154(b) by 495 days.

(21) Appl. No.: 17/722,198

(22) Filed: Apr. 15, 2022

(65) Prior Publication Data

US 2023/0238481 A1    Jul. 27, 2023

(30) Foreign Application Priority Data

Jan. 25, 2022   (KR) .................. 10-2022-0010598

(51) Int. Cl.
*H10H 20/816*   (2025.01)
*H10H 20/812*   (2025.01)
*H10H 20/831*   (2025.01)
*H10H 20/857*   (2025.01)

(52) U.S. Cl.
CPC ...... *H10H 20/8162* (2025.01); *H10H 20/812* (2025.01); *H10H 20/831* (2025.01); *H10H 20/857* (2025.01)

(58) Field of Classification Search
CPC .......... H10H 20/8162; H10H 20/812; H10H 20/831; H10H 20/857; A23B 11/162; H10D 8/055; H10D 89/601; H10D 84/858; H10D 30/0295; A45F 5/1525; A01N 1/146; H01L 2224/0344; H01L 25/0657; H01L 25/167
See application file for complete search history.

(56) References Cited

U.S. PATENT DOCUMENTS

| | | | |
|---|---|---|---|
| 2006/0255343 A1* | 11/2006 | Ogihara | B41J 2/45 257/E25.02 |
| 2021/0296528 A1* | 9/2021 | Fujiwara | A45F 5/1525 |
| 2023/0238420 A1* | 7/2023 | Kim | H10H 20/824 257/63 |
| 2023/0290305 A1* | 9/2023 | Kwon | G09G 3/3225 |

FOREIGN PATENT DOCUMENTS

KR      101102168 B1    1/2012

* cited by examiner

*Primary Examiner* — Marcos D. Pizarro
*Assistant Examiner* — Tiberiu Dan Onuta
(74) *Attorney, Agent, or Firm* — Renaissance IP Law Group LLP

(57) ABSTRACT

A unit pixel of a Red-Green-Cyan-Blue (RGCB) microdisplay is disclosed. In the unit pixel, sub-pixels that form blue light, green light, cyan light, and red light, are vertically stacked on a growth substrate. Accordingly, the unit pixel area may be reduced, and pixel transfer processing is facilitated.

19 Claims, 4 Drawing Sheets

UNIT PIXEL FOR RED-GREEN-CYAN-BLUE (RGCB) MICRO-DISPLAY HAVING VERTICALLY STACKED SUB-PIXELS

CROSS-REFERENCE TO RELATED APPLICATION

This application claims priority to Korean Patent Application No. 2022-0010598 filed on 01,25,2022 in the Korean Intellectual Property Office (KIPO), the entire contents of which are hereby incorporated by reference.

BACKGROUND

1. Technical Field

The present disclosure relates to a structure of a pixel of a red-green-cyan-blue (RGCB) microdisplay, which is composed a set of light sources of four colors which are red (R), green (G), cyan (C), and blue (B), and more particularly, to a structure in which sub-pixels are vertically stacked in one pixel.

2. Description of Related Art

Microdisplays are next generation display devices that are being actively developed by many display manufacturers. In the microdisplay, each pixel is composed of sub-pixels, and each of the sub-pixels forms red, green, or blue light. The sub-pixel that forms light of an intrinsic color has a structure of a light-emitting diode (LED). That is, there is an advantage in that an illuminant has an intrinsic, self-emitting color and thus a backlight is not required, when compared to a liquid-crystal display (LCD). In addition, the LED constituting the sub-pixel is made of an inorganic material and thus has very high reliability and stability. In addition, it is possible to obtain very clear images with less power consumption as compared with an organic light-emitting diode (OLED), and because it is possible to manufacture displays of various shapes by fabricating LEDs using a conventional metal organic chemical vapor deposition (MOCVD) process, it is known to be very advantageous for reducing the thickness of a display.

Further, in order for one pixel to realize full-color in a microdisplay, sub-pixels need to be spaced apart from each other on a substrate, and at least three sub-pixels need to be disposed in the same plane.

The arrangement of three sub-pixels in the same plane to form one unit pixel is a conventional method and is a technique being used in LCDs, OLEDs, and the like. In addition, while this arrangement is also expected to be applied to a microdisplay, there are several problems in applying the conventional pixel formation method to the microdisplay, which are very large obstacles for implementing the microdisplay.

First, the conventional pixel formation technique requires laborious sub-pixel transfer processes. A compound semiconductor formed on a growth substrate is diced into chips through a singulation process, and the individual chips need to be transferred onto a display substrate. Thus, a pick-and-place process is essential to manufacture the microdisplay. These processes are collectively referred to as a transfer process. In order to form a unit pixel with the conventional pixel formation technique, a transfer process needs to be performed at least three times per unit pixel. That is, a red LED, a green LED, and a blue LED need to be individually transferred onto the display substrate. Since one sub-pixel needs to have a size of about 10 μm or less, it is not easy to pick and place such a small-sized LED to a specific position on the display substrate, and because the process has to be repeated at least 3 times, it is also very burdensome.

Second, there is the problem of a black matrix. The black matrix is also used in a conventional LCD and the like and is used to prevent color interference between sub-pixels each of which realizes a particular color. The black matrix also needs to be used in sub-pixels of a micro display. In particular, the sub-pixel is composed of an LED, and an active layer or a multi-quantum well structure for forming light emits very high intensity light laterally due to crystallographic characteristics. Accordingly, when the black matrix is not used, a desired color may not be realized due to very severe light interference. Accordingly, it is essential to introduce the black matrix to prevent light interference between sub-pixels. However, as described above, in the LED sub-pixel, high intensity light formed in the active layer is emitted laterally due to the crystallographic characteristics. In the case of a blue LED, light tends to be emitted in a direction perpendicular to the c-axis direction. This phenomenon is due to inherent characteristics of an LED. In addition, the intensity of such lateral-emitted light is very high as compared with other displays such as an LCD or an OLED. Thus, in order to avoid light interference between adjacent sub-pixels, a thick black matrix needs to be formed, and the thick matrix may be achieved by increasing separation between the sub-pixels. When the separation distance between the sub-pixels increases, the unit pixel size increases, and thus the increased unit pixel size causes a reduction in the resolution of a display.

Third, in the case of a method of forming a single pixel by arranging sub-pixels in the same plane, there is a disadvantage in that one or more pixels of a display backplane must be used per single pixel of a display. That is, at least three pixels of the display backplane must be used per single pixel of the display, and typically four pixels are used.

Accordingly, a pixel structure capable of realizing a high resolution by easily implementing a small-sized pixel without having to arrange sub-pixels in the same plane is highly necessary.

Furthermore, for micro-LEDs emitting red (R) light, green (G) light, and blue (B) light, the green light emitting micro-LED has lower light-emitting efficiency than the blue and red light micro-LEDs, and thus the overall efficiency of the RGB pixel is reduced. When the red light emitting micro-LED is a non-nitride semiconductor, the red light emitting micro-LED is thermally unstable as compared with the blue and green light emitting micro-LEDs made of a nitride semiconductor, and thus its emission wavelength may be easily changed due to the influence of the ambient temperature. Consequently, it is not easy to establish stability of the reproduced color.

SUMMARY

Example embodiments of the present inventive concept provide a structure of a pixel of a Red-Green-Cyan-Blue (RGCB) microdisplay having vertically stacked sub-pixels.

Example embodiments of the present inventive concept provide a unit pixel of an RGCB microdisplay including a first n-type contact layer formed on a growth substrate, a second n-type contact layer formed on the first n-type contact layer, a first sub-pixel formed on the second n-type contact layer, a second sub-pixel formed on the first sub-pixel, a first common electrode layer formed between the first sub-pixel and the second sub-pixel, a third sub-pixel formed on the second sub-pixel, and a fourth sub-pixel formed on the third sub-pixel, wherein the first sub-pixel and the second sub-pixel are connected to the second n-type contact layer, and the third sub-pixel and the fourth sub-pixel are connected to the first n-type contact layer.

The unit pixel of an RGCB microdisplay may further include a first current blocking layer formed between the first n-type contact layer and the second n-type contact layer, and a second current blocking layer formed between the second sub-pixel and the third sub-pixel.

The first current blocking layer and the second current blocking layer may each be a p-type semiconductor or an insulating material.

The unit pixel of an RGCB microdisplay may further include a first n-type contact semiconductor layer formed between the second sub-pixel and the second current blocking layer, and a second n-type contact semiconductor layer formed between the third sub-pixel and the fourth sub-pixel.

The unit pixel of an RGCB microdisplay may further include a first tunnel junction layer formed between the first common electrode layer and the first sub-pixel, a second tunnel junction layer formed between the first n-type contact semiconductor layer and the second sub-pixel, and a third tunnel junction layer formed between the second n-type contact semiconductor layer and the third sub-pixel.

The unit pixel of an RGCB microdisplay may further include a bonding layer formed between the second n-type contact semiconductor layer and the fourth sub-pixel.

The first sub-pixel may include a first n-type semiconductor layer, a first active layer, and a first p-type semiconductor layer which are sequentially stacked, the second sub-pixel may include a second n-type semiconductor layer, a second active layer, and a second p-type semiconductor layer which are sequentially stacked, the third sub-pixel may include a third n-type semiconductor layer, a third active layer, and a third p-type semiconductor layer which are sequentially stacked, and the fourth sub-pixel may include a fourth p-type semiconductor layer, a fourth active layer, and a fourth n-type semiconductor layer which are sequentially stacked.

The unit pixel of an RGCB microdisplay may include a first interconnect layer configured to electrically connect the second n-type contact layer and the first n-type contact semiconductor layer, a second interconnect layer configured to electrically connect the first n-type contact layer, the third n-type semiconductor layer, and the fourth p-type semiconductor layer, and a common contact electrode layer formed on an exposed surface of each of the first common electrode layer and the second n-type contact semiconductor layer and covering the fourth n-type semiconductor layer.

The first interconnect layer may be formed on an exposed portion of each of the second n-type contact layer and the first n-type contact semiconductor layer, the second interconnect layer may be formed on an exposed portion of each of the fourth p-type semiconductor layer, the third n-type semiconductor layer, and the first n-type contact layer, and the second interconnect layer may be formed to extend from the fourth p-type semiconductor layer to the first n-type contact layer so that the fourth p-type semiconductor layer, the third n-type semiconductor layer, and the first n-type contact layer are electrically connected to each other.

The fourth active layer may include AlInGaP.

The unit pixel of an RGCB microdisplay may further include a first n-type contact semiconductor layer formed between the second sub-pixel and the second current blocking layer and a second common electrode layer formed between the third sub-pixel and the fourth sub-pixel.

The unit pixel of an RGCB microdisplay may further include a first n-type contact semiconductor layer formed between the second sub-pixel and the second current blocking layer and a second common electrode layer formed between the third sub-pixel and the fourth sub-pixel.

The unit pixel of an RGCB microdisplay may further include a first tunnel junction layer formed between the first common electrode layer and the first sub-pixel, a second tunnel junction layer formed between the first n-type contact semiconductor layer and the second sub-pixel, and a third tunnel junction layer formed between the second common electrode layer and the third sub-pixel.

The first sub-pixel may include a first n-type semiconductor layer, a first active layer, and a first p-type semiconductor layer which are sequentially stacked, the second sub-pixel may include a second n-type semiconductor layer, a second active layer, and a second p-type semiconductor layer which are sequentially stacked, the third sub-pixel may include a third n-type semiconductor layer, a third active layer, and a third p-type semiconductor layer which are sequentially stacked, and the fourth sub-pixel may include a fourth n-type semiconductor layer, a fourth active layer, and a fourth p-type semiconductor layer which are sequentially stacked.

The unit pixel of an RGCB microdisplay may include a first interconnect layer configured to electrically connect the second n-type contact layer and the first n-type contact semiconductor layer, a second interconnect layer configured to electrically connect the first n-type contact layer, the third n-type semiconductor layer, and the fourth p-type semiconductor layer, and a common contact electrode layer formed on an exposed surface of each of the first common electrode layer and the second common electrode layer and covering the fourth p-type semiconductor layer, wherein the fourth p-type semiconductor layer and the common contact electrode layer are insulated from each other.

The first interconnect layer may be formed on an exposed portion of each of the second n-type contact layer and the first n-type contact semiconductor layer, the second interconnect layer may be formed on an exposed portion of each of the fourth p-type semiconductor layer, the third n-type semiconductor layer, and the first n-type contact layer, and the second interconnect layer may be formed to extend from the fourth p-type semiconductor layer to the first n-type contact layer so that the fourth p-type semiconductor layer, the third n-type semiconductor layer, and the first n-type contact layer are electrically connected to each other.

When a negative pulse is applied to the first n-type contact layer and the second n-type contact layer, the first sub-pixel and the third sub-pixel may emit light, and when a positive pulse is applied to the first n-type contact layer and the second n-type contact layer, the second sub-pixel and the fourth sub-pixel may emit light.

The first sub-pixel may form light having a first wavelength, the second sub-pixel may form light having a second wavelength longer than the first wavelength, the third sub-pixel forms light having a third wavelength longer than the second wavelength, and the fourth sub-pixel forms light having a fourth wavelength longer than the third wavelength.

The first wavelength may form blue (B) light, the second wavelength may form cyan (C) light, the third wavelength may form green (G) light, and the fourth wavelength may form red (R) light.

BRIEF DESCRIPTION OF DRAWINGS

Example embodiments of the present inventive concept will become more apparent by describing in detail example embodiments of the present inventive concept with reference to the accompanying drawings, in which.

DESCRIPTION OF EXAMPLE EMBODIMENTS

Figure 1:
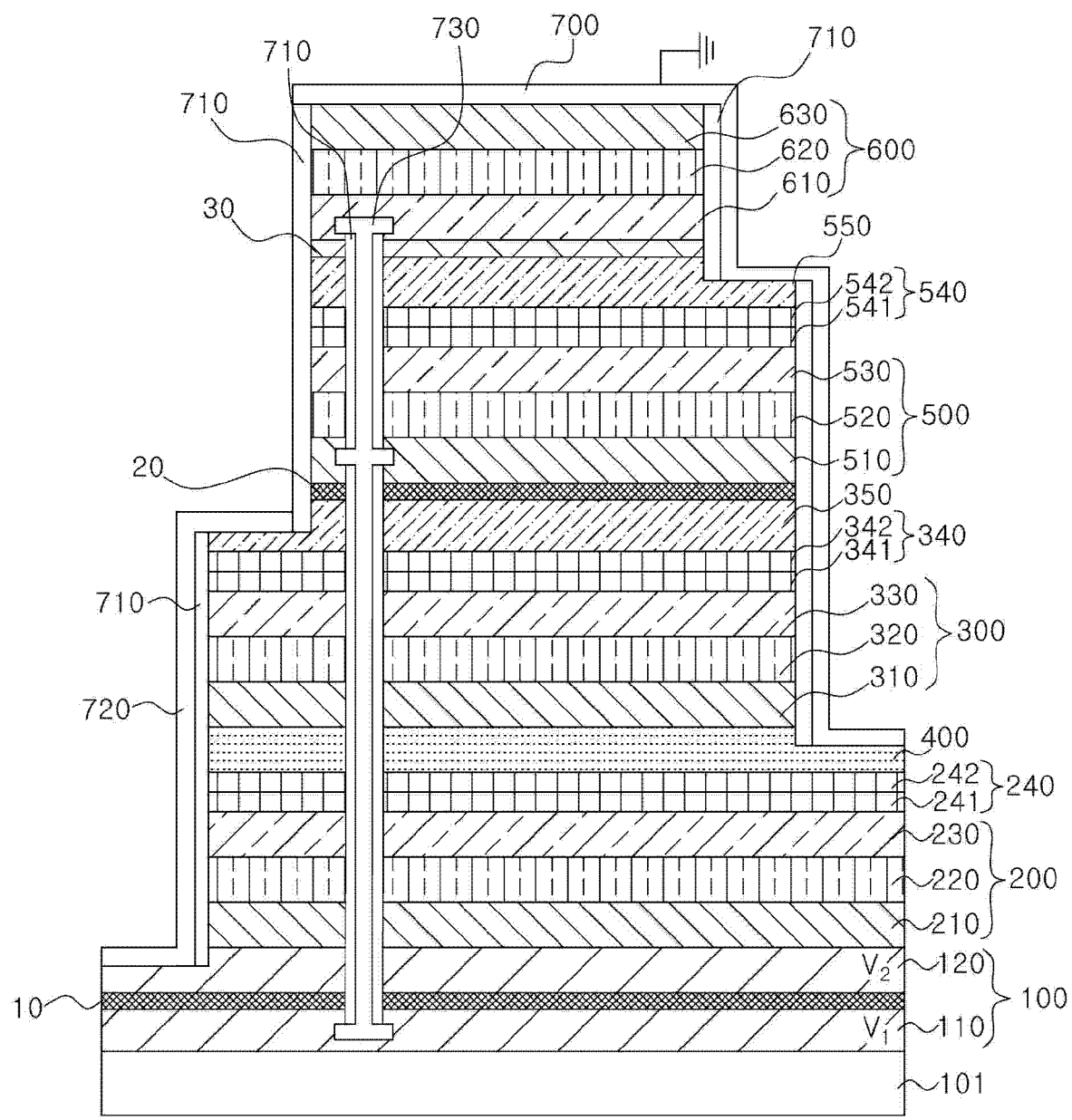
FIG. 1 is a schematic cross-sectional view of a pixel of a Red-Green-Cyan-Blue (RGCB) microdisplay according to a first example embodiment of the present inventive concept.

Hereinafter, example embodiments of the present inventive concept will be described in detail with reference to the accompanying drawings.

The present inventive concept is susceptible to various modifications and changes, particular example embodiments of which will be exemplified in the drawings and described in detail. However, the present inventive concept is not intended to be limited to the particular form disclosed, but rather, the present inventive concept includes all modifications, equivalents, and substitutions that are combined with the spirit of the present inventive concept as defined by the claims.

It will be understood that when an element such as a layer, region, or substrate is referred to as being present "on" another constituent element, the element may be disposed directly on another element or still another element may be present therebetween.

It will be understood that although the terms first, second, and the like may be used to describe various elements, components, regions, layers and/or sections, these elements, components, regions, layers, and/or sections should not be limited by these terms.

First Example Embodiment

FIG. 1 is a schematic cross-sectional view of a pixel of a Red-Green-Cyan-Blue (RGCB) microdisplay according to the example embodiment of the present inventive concept.

Referring to FIG. 1, the pixel of the RGCB microdisplay according to the present inventive concept includes a contact layer 100, a first sub-pixel 200, a second sub-pixel 300, a first common electrode layer 400, a third sub-pixel 500, and a fourth sub-pixel 600.

The contact layer 100 may be formed on a growth substrate 101. As the growth substrate 101, any substrate used for light-emitting devices may be applied, and specifically, the growth substrate 101 may be, for example, a sapphire ($Al_2O_3$) substrate, a SiC substrate, a GaN substrate, a GaP substrate, a GaAs substrate, an InP substrate, or a ZnO substrate, but the present inventive concept is not limited thereto.

The contact layer 100 may be formed on the growth substrate 101, and a pulse of voltage for operating the pixel of the RGCB microdisplay may be externally applied to the contact layer 100.

Further, the contact layer 100 may include a first n-type contact layer 110 and a second n-type contact layer 120. The first n-type contact layer 110 may be formed on the growth substrate 101, and the second n-type contact layer 120 may be sequentially formed on the first n-type contact layer 110.

As an example, the first n-type contact layer 110 may be connected to the third sub-pixel 500 and the fourth sub-pixel 600, and the second n-type contact layer 120 may be connected to the first sub-pixel 200 and the second sub-pixel 300. However, the first n-type contact layer 110 may be connected to an n-type semiconductor of the third sub-pixel 500 and may be commonly connected to a p-type semiconductor of the fourth sub-pixel 600. In addition, the second n-type contact layer 120 may be connected to an n-type semiconductor of the first sub-pixel 200 and may be commonly connected to a p-type semiconductor of the second sub-pixel 300.

That is, currents flowing to the first sub-pixel 200 and the third sub-pixel 500 may be in the same direction, and currents flowing to the second sub-pixel 300 and the fourth sub-pixel 600 may be in the same direction. Accordingly, light emitted from the sub-pixels 200, 300, 500, and 600 may be selectively controlled according to the polarity of a pulse of voltage applied to the first n-type contact layer 110 and the second n-type contact layer 120.

For example, the first sub-pixel 200, the second sub-pixel 300, the third sub-pixel 500, and the fourth sub-pixel 600 may be commonly connected through a common contact electrode layer 700 to be described below, and from the commonly-connecting common contact electrode layer 700, the pair of sub-pixels consisting of first and second sub-pixels 200 and 300 and the pair of sub-pixels consisting of third and fourth sub-pixels 500 and 600 are separately connected to the first n-type contact layer 110 and the second n-type contact layer 120, respectively. As an example, the first sub-pixel 200 and the third sub-pixel 500 may be forward biased, and the second sub-pixel 300 and the fourth sub-pixel 600 may be reverse biased.

The first n-type contact layer 110 and the second n-type contact layer 120 may be made of a GaN material, and Si may be used as a dopant. In addition, each of the n-type contact layers 110 and 120 may preferably be formed to have a thickness of 1 to 2 μm.

In the present embodiment, it is configured such that currents flow through the first sub-pixel 200 and the third sub-pixel 500 in the same direction, and currents flow through the second sub-pixel 300 and the fourth sub-pixel 600 in the same direction, but a configuration in which currents flows in opposite directions is also possible.

Further, a first current blocking layer 10 may be formed between the first n-type contact layer 110 and the second n-type contact layer 120.

The first current blocking layer 10 is formed between the contact layers 110 and 120 to block a leakage current between the contact layers 110 and 120. In order for the current flowing through each of the contact layers 110 and 120 to be blocked, the first current blocking layer 10 may have a high resistance or may be reverse-biased with respect to the contact layers 110 and 120. For example, since the first current blocking layer 10 is in contact with the first n-type contact layer 110 and the second n-type contact layer 120, the first current blocking layer 10 may be set as a p-type semiconductor layer to form reverse-biased junctions vertically. In addition, the first current blocking layer 10 may be formed of non-conducting GaN doped with a transition metal, or $SiO_2$, which is an insulating material.

When the first current blocking layer 10 is formed of a p-type semiconductor layer, Mg-doped GaN or Mg-doped AlGaN may be used as the p-type semiconductor layer, and when the first current blocking layer 10 is formed of an insulating layer, Fe-doped GaN or $SiO_2$ may be used as the insulating layer. When Fe is doped, Fe atoms also act as deep level acceptors and may result in a very high value of resistance.

For example, in Fe-doped GaN, a sheet resistance has a value of 200 kQ/□ at a Fe concentration of $1.7 \times 10^{18}$ cm$^{-3}$, and a sheet resistance has a value of $7 \times 10^9$ kQ/□ at a Fe concentration of $1.3 \times 10^{19}$ cm$^{-3}$. Accordingly, the doping concentration of Fe in the first current blocking layer 10 may preferably be $1 \times 10^{19}$ cm$^{-3}$ or more. The thickness of the first current blocking layer 10 needs to be 100 nm or more and 1 μm or less. When the thickness of the first current blocking layer 10 is less than 100 nm, a sufficient resistance value may not be obtained, and when the thickness the first current blocking layer 10 exceeds 1 μm, productivity may be reduced due to excessive layer growth time.

Further, in addition to Fe, a transition metal such as Mn, Co, Ni, or Cu may be used as a dopant acting as a deep level acceptor.

Further, the first current blocking layer 10 may have p-type conductivity. That is, the first current blocking layer 10 may be in contact with the first n-type contact layer 110 and the second n-type contact layer 120. Accordingly, current flowing from the respective contact layers 110 and 120 toward the first current blocking layer 10 may be blocked due to reverse-bias junctions.

The sub-pixels 200, 300, 500, and 600 may be formed on the contact layers 110 and 120. That is, the first sub-pixel 200, the second sub-pixel 300, the third sub-pixel 500, and the fourth sub-pixel 600 may be formed on the contact layers 110 and 120.

Here, the second sub-pixel 300 may have a structure of being stacked on the first sub-pixel 200, the third sub-pixel 500 may have a structure of being stacked on the second sub-pixel 300, and the fourth sub-pixel 600 may have a structure of being stacked on the third sub-pixel 500. That is, the first sub-pixel 200, the second sub-pixel 300, the third sub-pixel 500, and the fourth sub-pixel 600 may have a sequentially stacked structure.

The first sub-pixel 200 forms light having a first wavelength, the second sub-pixel 300 forms light having a second wavelength longer than the first wavelength, and the third sub-pixel 500 forms light having a third wavelength longer than the second wavelength. In addition, the fourth sub-pixel 600 forms light having a fourth wavelength longer than the third wavelength. As an example, the first sub-pixel 200 may emit blue light, the second sub-pixel 300 may emit cyan light, and the third sub-pixel 500 may emit green light. In addition, the fourth sub-pixel 600 may emit red light.

The first sub-pixel 200, a first tunnel junction layer 240, the first common electrode layer 400, the second sub-pixel 300, a second tunnel junction layer 340, and a first n-type contact semiconductor layer 350 may be sequentially formed on the second n-type contact layer 120. Here, the first sub-pixel 200 may include a first n-type semiconductor layer 210, a first active layer 220, and a first p-type semiconductor layer 230, and the second sub-pixel 300 may include a second n-type semiconductor layer 310, a second active layer 320, and a second p-type semiconductor layer 330.

That is, the first sub-pixel 200 may be formed in a structure in which the first n-type semiconductor layer 210, the first active layer 220, and the first p-type semiconductor layer 230 are sequentially stacked, and the second sub-pixel 300 may be formed in a structure in which the second n-type semiconductor layer 310, the second active layer 320, and the second p-type semiconductor layer 330 are sequentially stacked.

The first n-type semiconductor layer 210 and the second n-type semiconductor layer 310 may be compound semiconductor layers that provide electrons to the first active layer 220 and the second active layer 320, respectively, and may be compound semiconductor layers of group III-V elements to which an n-type impurity such as Sn, Si, N, P, Ge, or Se is added. Specifically, for example, while the first n-type semiconductor layer 210 and the second n-type semiconductor layer 310 may be n-type doped GaN, AlGaN, InGaN, InAlGaN, AlN, InN, AlInN, GaAs, GaAsP, or AlGaAs, a GaN material may be preferable, and Si may be used as a dopant.

Here, the first n-type semiconductor layer 210 may be a semiconductor layer having the same material as the second n-type contact layer 120. Accordingly, any one of the first n-type semiconductor layer 210 and the second n-type contact layer 120 may be omitted according to the example embodiments. As an example, when the first n-type semiconductor layer 210 is omitted, the second n-type contact layer 120 may serve as the first n-type semiconductor layer 210 as well as the contact layer.

The first active layer 220 and the second active layer 320 are layers in which electrons injected from the first n-type semiconductor layer 210 and second n-type semiconductor layer 310 and holes injected from the first p-type semiconductor layer 230 and the second p-type semiconductor layer 330 respectively recombine to emit light, may emit light of various colors depending on the composition of constituent materials, and may use all typical active layer materials. Specifically, for example, the first active layer 220 and the second active layer 320 may each have a multi-quantum well (MQW) or single quantum well structure in which an In$_x$Al$_y$Ga(1-x-y) N (0≤x<1, 0≤y<1, and 0≤x+y<1) layer forms a well layer and an In$_a$Al$_b$Ga(1-a-b) N (0≤a<1, 0 b≤1, and 0≤a+b<1) layer forms a barrier layer. Here, "a" and "b" are irrespective of "x" and "y" and serve to form a barrier structure. Alternatively, the first active layer 220 and the second active layer 320 may include a zinc oxide-based material such as ZnMgO or ZnCdO, and depending on the example embodiment, the first active layer 220 and the second active layer 320 may be formed of a doped compound semiconductor. However, the band gap of the well layer of the first active layer 220 needs to be larger than the band gap of the well layer of the second active layer 320, which may be implemented by controlling the fraction of In.

The first p-type semiconductor layer 230 and the second p-type semiconductor layer 330 may be compound semiconductor layers that provide holes to the first active layer 220 and the second active layer 320, respectively, and may be compound semiconductor layers of group III-V elements to which a p-type impurity such as Mg, N, P, As, Zn, Li, or Cu is added. Specifically, for example, while the first p-type semiconductor layer 230 and the second p-type semiconductor layer 330 may each be p-type doped GaN, AlGaN, InGaN, InAlGaN, AlN, InN, AlInN, GaAs, GaAsP, or AlGaAs, a GaN material may be preferable, and Mg may be used as the dopant.

In addition, the first common electrode layer 400 may be formed between the first sub-pixel 200 and the second sub-pixel 300, and the first n-type contact semiconductor layer 350 may be formed on the second sub-pixel 300. In addition, the first tunnel junction layer 240 may be formed between the first sub-pixel 200 and the first common electrode layer 400, and the second tunnel junction layer 340 may be formed between the second sub-pixel 300 and the first n-type contact semiconductor layer 350.

Here, the first common electrode layer 400 may be formed to be in contact with the first tunnel junction layer 240 formed on the first sub-pixel 200 and the second n-type semiconductor layer 310 of the second sub-pixel 300, and the first n-type contact semiconductor layer 350 may be formed to be in contact with the second tunnel junction layer 340. The first common electrode layer 400 and the first n-type contact semiconductor layer 350 may be n-type semiconductors, for example, n-GaN, but the present inventive concept is not limited thereto.

The first tunnel junction layer 240 is disposed on a lower surface of the first common electrode layer 400. The first tunnel junction layer 240 may have, for example, a structure in which a first $n^{++}$-GaN layer 242 and a second $p^{++}$-GaN layer 241 are sequentially disposed in a downward direction from the first common electrode layer 400, or a structure in which the second $p^{++}$-GaN layer 241 and the first $n^{++}$-GaN layer 242 are sequentially stacked.

The second tunnel junction layer 340 is disposed on a lower surface of the first n-type contact semiconductor layer 350. The second tunnel junction layer 340 may have, for example, a structure in which a second $p^{++}$-GaN layer 341 and a second $n^{++}$-GaN layer 342 are sequentially disposed in an upward direction from the second sub-pixel 300, or a structure in which the second $p^{++}$-GaN layer 341 and the second $n^{++}$-GaN layer 342 are sequentially stacked.

Since the first tunnel junction layer 240 is disposed on the lower surface of the first common electrode layer 400 that is an n-type semiconductor such as n-GaN, and the second tunnel junction layer 340 is disposed on the lower surface of the first n-type contact semiconductor layer 350, in the first sub-pixel 200, holes may be injected into the first active layer 220 through the first common electrode layer 400, and in the second sub-pixel 300, holes may be injected into the second active layer 320 through the first n-type contact semiconductor layer 350.

In addition, since it is possible to form the first common electrode layer 400 and the first n-type contact semiconductor layer 350 as n-type semiconductors, into which holes are injected, the current is well spread in the first common electrode layer 400 as compared with the conventional method in which a hole injection layer is formed of a p-type semiconductor, thereby improving light-emitting efficiency of a light-emitting diode (LED). However, since the second n-type semiconductor layer 310 of the second sub-pixel 300 is disposed on an upper surface of the first common electrode layer 400, the first sub-pixel 200 and the second sub-pixel 300 may be commonly connected to the first common electrode layer 400, while having a structure in which current directions are opposite.

The tunnel junction layers 240 and 340 described above may not be a sequential structure of the $n^{++}$-GaN layer and the $p^{++}$-GaN layer. That is, the two tunnel junction layers 240 and 340 may be composed of only the $p^{++}$-GaN layer. Zener breakdown of charge carriers needs to be generated by the tunnel junction layers 240 and 340 respectively bonded to lower portions of the first common electrode layer 400 and the first n-type contact semiconductor layer 350. Accordingly, the first common electrode layer 400 and the first n-type contact semiconductor layer 350 may also be highly doped. When energy states of an n-type conduction band and a p-type valance band are at the same level or the p-type valance band is higher than the n-type conduction band to cause the Zener breakdown, electron tunneling is generated by reverse biasing. Thus, holes are modeled as being supplied from the n-type first common electrode layer 400 and the first n-type contact semiconductor layer 350 to the active layers.

In particular, since the first common electrode layer 400 and the first n-type contact semiconductor layer 350 are doped n-type, the first common electrode layer 400 and the first n-type contact semiconductor layer 350 have an excellent current spreading capability. Accordingly, the charge carriers are distributed evenly over the entire area of the active layers in which the light-emitting operation is performed, thereby leading to an increase in light-emitting efficiency.

Further, in the present inventive concept, the first common electrode layer 400 and the first n-type contact semiconductor layer 350 may be doped n-type and may be doped at a high concentration. Doping at a high concentration means that the highly doped layer has a higher dopant concentration than the first n-type semiconductor layer 210. In addition, $n^{++}$ doping means having a higher dopant concentration than the first n-type semiconductor layer 210. In addition, $p^{++}$ doping means having a higher dopant concentration than the first p-type semiconductor layer 230 or the second p-type semiconductor layer 330. Hereinafter, the meaning of $n^{++}$ doping and the meaning of $p^{++}$ doping with respect to the doping level are equally applied.

Further, the layers formed on the growth substrate 101 may be formed through a known deposition method, for example, a metal organic chemical vapor deposition (MOCVD) method, a hydride vapor phase epitaxy (HVPE) method, a molecular beam epitaxy (MBE) method, a plasma laser deposition (PLD) method, or sputtering method, but the present inventive concept is not limited thereto.

A second current blocking layer 20 may be formed on the first n-type contact semiconductor layer 350. The second current blocking layer 20 may be formed of a p-type semiconductor or an insulating layer. P-type GaN or p-type AlGaN may be used as the p-type semiconductor, and Fe-doped GaN or $SiO_2$ may be used as the insulating layer.

In particular, when the second current blocking layer 20 is an $SiO_2$ material, the compound semiconductor may not be easily grown on the current blocking layer. Accordingly, when $SiO_2$ is used as a current blocking layer, a process of wafer-bonding upper and lower sub-pixels with $SiO_2$ as the bonding agent may be used. In addition, when the second current blocking layer 20 is a p-type semiconductor or a Fe-doped GaN, a compound semiconductor may be grown on the second current blocking layer 20. Further, since the second current blocking layer 20 is formed between the second sub-pixel 300 and the third sub-pixel 500, the second current blocking layer 20 may block a leakage current between the second sub-pixel 300 and the third sub-pixel 500.

The third sub-pixel 500, a third tunnel junction layer 540, and a second n-type contact semiconductor layer 550 may be sequentially formed on the second current blocking layer 20.

Further, the third sub-pixel 500 may include a third n-type semiconductor layer 510, a third active layer 520, and a third p-type semiconductor layer 530. The third n-type semiconductor layer 510, the third active layer 520, and the third p-type semiconductor layer 530 may be sequentially formed on the second current blocking layer 20.

The third n-type semiconductor layer 510, the third active layer 520, and the third p-type semiconductor layer 530 of the third sub-pixel 500 may preferably have the same material respectively as the n-type semiconductor layer, the active layer, and the p-type semiconductor layer of each of the first sub-pixel 200 and the second sub-pixel 300. As an example, the third n-type semiconductor layer 510 may preferably be made of a GaN material, and Si may be used as a dopant. In addition, the third p-type semiconductor layer 530 may be made of a GaN material, and Mg may preferably be used as a dopant. The third active layer 520 may have a multi-quantum well structure and preferably emit green light. Accordingly, the third active layer 520 of the third sub-pixel 500 may perform a light-emitting operation by controlling the band gap of a GaN-based material according to the change in the fraction of In therein.

The third tunnel junction layer 540 is disposed on a lower surface of the second n-type contact semiconductor layer 550. Here, the second n-type contact semiconductor layer 550 may be an n-type semiconductor, for example, n-GaN, but the present inventive concept is not limited thereto. In addition, the third tunnel junction layer 540 may have, for example, a structure in which a third $p^{++}$-GaN layer 541 and a third $n^{++}$-GaN layer 542 are sequentially disposed in an upward direction from the third tunnel junction layer 540, or a structure in which the third $p^{++}$-GaN layer 541 and the third $n^{++}$-GaN layer 542 are sequentially disposed.

Since the third tunnel junction layer 540 is disposed on the lower surface of the second n-type contact semiconductor layer 550 which is provided as an n-type semiconductor such as n-GaN, in the third sub-pixel 500, holes may be injected into the third active layer 520 through the second n-type contact semiconductor layer 550.

The fourth sub-pixel 600 may be formed on the second n-type contact semiconductor layer 550. The fourth sub-pixel 600 may include a fourth p-type semiconductor layer 610, a fourth active layer 620, and a fourth n-type semiconductor layer 630. In addition, a bonding layer 30 may be formed between the second n-type contact semiconductor layer 550 and the fourth sub-pixel 600. That is, the fourth p-type semiconductor layer 610, the fourth active layer 620, and the fourth n-type semiconductor layer 630 may be sequentially disposed on the bonding layer 30.

The fourth sub-pixel 600 is grown on a separate substrate other than the growth substrate 101 on which the first sub-pixel 200, the second sub-pixel 300, and the third sub-pixel 500 are formed. For example, the fourth sub-pixel 600 is formed on a GaAs substrate and is bonded to the third sub-pixel 500 through the bonding layer 30. In addition, the GaAs substrate used for the growth of the third sub-pixel 500 may be easily removed by an acid solution or the like. As for material for the bonding layer 30, any transparent material is appropriate, but a polymer material having an adhesive property is preferable.

The fourth p-type semiconductor layer 610 is made of an AlInGaP material and Mg is used as a dopant. In addition, it is preferable that the fourth active layer 620 is made of an AlInGaP material and have a quantum well structure by controlling the fraction of In. The fourth n-type semiconductor layer 630 is also made of an AlInGaP material and Si is used as a dopant.

The common contact electrode layer 700 is formed on the fourth n-type semiconductor layer 630, and the common contact electrode layer 700 covers the fourth n-type semiconductor layer 630. In addition, the common contact electrode layer 700 may be connected to the ground. The common contact electrode layer 700 is made of a metal material, and covers side surfaces of the second sub-pixel 300, the third sub-pixel 500, and the fourth sub-pixel 600. However, when the common contact electrode layer 700 covers the side surfaces of the second sub-pixel 300, the third sub-pixel 500, and the fourth sub-pixel 600, the common contact electrode layer 700 may be electrically connected to other active layers, and thus an insulating layer 710 may be interposed between the common contact electrode layer 700 and the side surfaces of the second sub-pixel 300, the third sub-pixel 500, and the fourth sub-pixel 600.

Further, the common contact electrode layer 700 is also formed on a partially exposed surface of each of the first common electrode layer 400 and the second n-type contact semiconductor layer 550. That is, the common contact electrode layer 700 is electrically connected to the first common electrode layer 400 and the second n-type contact semiconductor layer 550. It is known in the art that an anode is formed on the entire surface of a p-type semiconductor layer or only on a portion thereof. However, in the present inventive concept, in order to evenly supply a current to each of the sub-pixels and to supply a uniform current to each of the active layers, the common contact electrode layer 700 is connected to the n-type first common electrode layer 400 and the second n-type contact semiconductor layer 550 having a high conductivity. In addition, since the common contact electrode layer 700 is formed over the entire fourth n-type semiconductor layer 630, the current may also be evenly supplied to the fourth n-type semiconductor layer 630. Accordingly, the phenomenon in which the current is locally concentrated in an active layer is prevented.

A first interconnect layer 720 may be formed on an exposed portion of the second n-type contact layer 120 and an exposed portion of the first n-type contact semiconductor layer 350, and may electrically connect the second n-type contact layer 120 and the first n-type contact semiconductor layer 350 while covering side surfaces of the first sub-pixel 200, the first common electrode layer 400, and the second sub-pixel 300. However, when the first interconnect layer 720 covers the side surfaces of the first sub-pixel 200, the first common electrode layer 400, and the second sub-pixel 300, the first interconnect layer 720 may be electrically connected to other active layers, and thus the insulating layer 710 may be interposed therebetween.

In the above-described structure, the first sub-pixel 200 and the second sub-pixel 300 are connected by one common contact electrode layer 700 and the first interconnect layer 720. That is, since the common contact electrode layer 700 is connected to the first common electrode layer 400 and the first interconnect layer 720 is connected to the second n-type contact layer 120 and the first n-type contact semiconductor layer 350, the first sub-pixel 200 and the second sub-pixel 300 may have a structure in which the anode of one sub-pixel and the cathode of the other sub-pixel are commonly connected and the current directions in the sub-pixels are opposite to each other.

A second interconnect layer 730 may be formed on the fourth p-type semiconductor layer 610, the third n-type semiconductor layer 510, and the first n-type contact layer 110 exposed through etching or the like, and may be formed to extend from the fourth p-type semiconductor layer 610 to the first n-type contact layer 110 so that the fourth p-type semiconductor layer 610, the third n-type semiconductor layer 510, and the first n-type contact layer 110 are electrically connected to each other. However, the extending portion of the second interconnect layer 730 may be electrically connected to other active layers and thus may be covered by the insulating layer 710.

In the above-described structure, the third sub-pixel 500 and the fourth sub-pixel 600 are connected by one common contact electrode layer 700 and the second interconnect layer 730. That is, since the common contact electrode layer 700 is connected to the second n-type contact semiconductor layer 550 and the fourth n-type semiconductor layer 630, and the second interconnect layer 730 is connected to the third n-type semiconductor layer 510, the fourth p-type semiconductor layer 610, and the first n-type contact layer 110, the third sub-pixel 500 and the fourth sub-pixel 600 may have a structure in which the anode of one sub-pixel and the cathode of the other sub-pixel are commonly connected, and the current directions in the sub-pixels are opposite to each other.

As an example, when a negative pulse is provided to the first n-type contact layer 110 and the second n-type contact layer 120, a first current flows through the first sub-pixel 200 connected to the second n-type contact layer 120, and light having a first wavelength due to the flowing first current is formed in the first active layer 220. In addition, a third current flows through the third sub-pixel 500 connected to the first n-type contact layer 110, and light having a third wavelength longer than the first wavelength is formed in the third active layer 520 due to the flowing third current. At this point, the first current and the third current flowing through the first n-type contact layer 110 and the second n-type contact layer 120 are prevented from interfering with each other by the first current blocking layer 10.

In contrast, when a positive pulse is input to the first n-type contact layer 110 and the second n-type contact layer 120, a second current flows through the second sub-pixel 300 connected to the second n-type contact layer 120, and light having a second wavelength longer than the first wavelength and shorter than the third wavelength is formed in the second active layer 320 due to the flowing second current. In addition, a fourth current flows through the fourth sub-pixel 600 connected to the first n-type contact layer 110, and light having a fourth wavelength longer than the third wavelength is formed in the fourth active layer 620 due to the flowing fourth current.

The formed light of the first wavelength, the formed light of the second wavelength, the formed light of the third wavelength, and the formed light of the fourth wavelength may be directed toward the growth substrate 101 and may be directed away from the growth substrate 101. However, the light traveling away from the growth substrate 101 is reflected by the common contact electrode layer 700 formed on the entire surface of the fourth n-type semiconductor layer 630 and is directed toward the growth substrate 101. Accordingly, the four types of formed light are emitted toward the growth substrate 101. Thus, a specific color using four types of light is realized.

Figure 2:
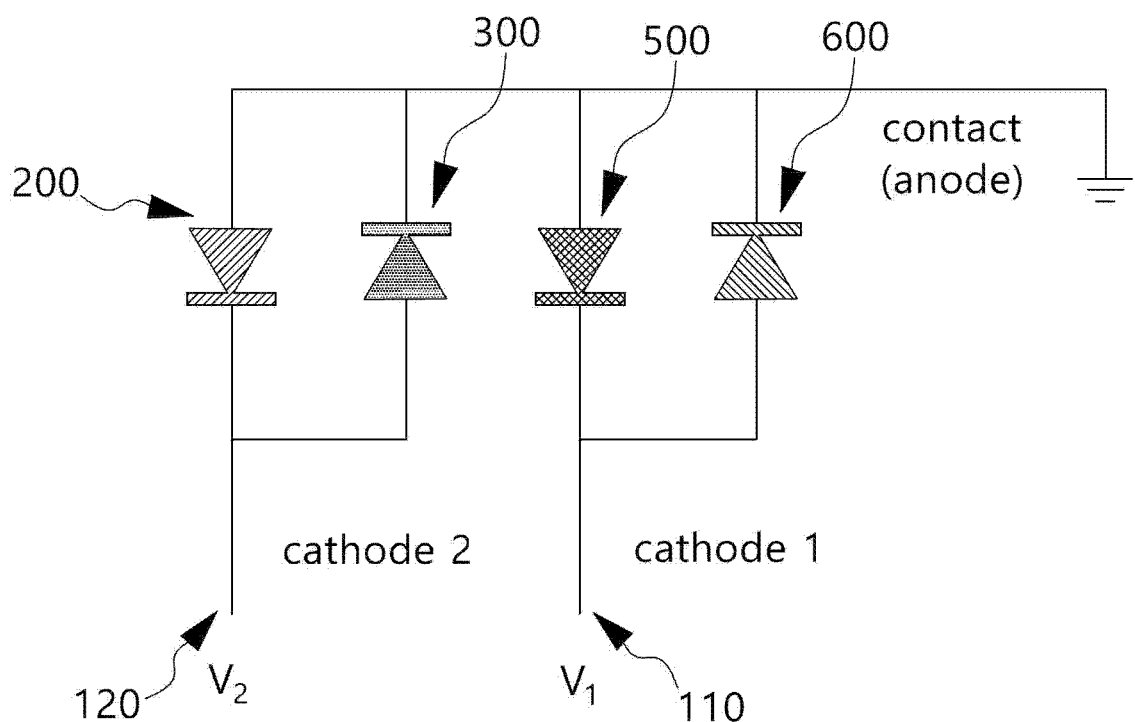
FIG. 2 is a circuit diagram schematically illustrating an equivalent circuit of the pixel of the RGCB microdisplay illustrated in FIG. 1.

FIG. 2 is a circuit diagram schematically illustrating an equivalent circuit of the pixel of the RGCB micro display illustrated in FIG. 1.

Figure 3:
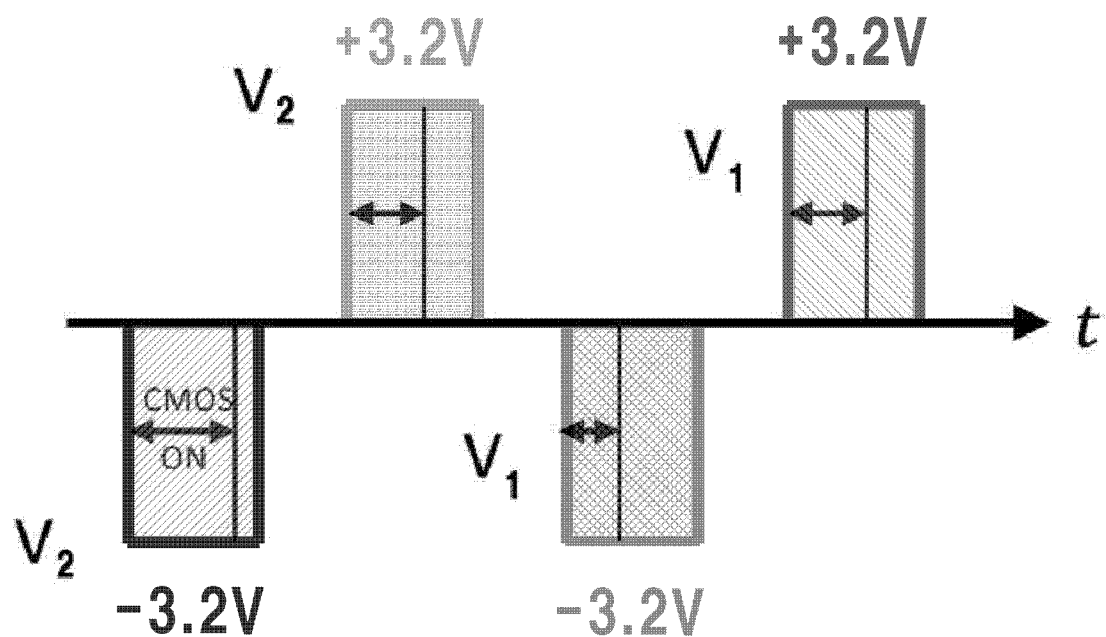
FIG. 3 is a diagram illustrating an applied signal applied to the pixel of the RGCB microdisplay illustrated in FIG. 1.

FIG. 3 is a diagram illustrating a signal applied to the pixel of the RGCB micro display illustrated in FIG. 1.

Referring to FIGS. 2 and 3, the first sub-pixel 200, the second sub-pixel 300, the third sub-pixel 500, and the fourth sub-pixel 600 are commonly connected to the common contact electrode layer 700 connected to the ground, the first sub-pixel 200 and the second sub-pixel 300 are commonly connected to the second n-type contact layer 120, and the third sub-pixel 500 and the fourth sub-pixel 600 are commonly connected to the first n-type contact layer 110. However, in the first sub-pixel 200 and the third sub-pixel 500, an n-type semiconductor is connected to each of the second n-type contact layer 120 and the first n-type contact layer 110, and in the second sub-pixel 300 and the fourth sub-pixel 600, a p-type semiconductor is connected to each of the second n-type contact layer 120 and the first n-type contact layer 110. Accordingly, when a voltage difference is applied between the common contact electrode layer 700 and the separately formed n-type contact layers 110 and 120, each of the sub-pixels starts a light-emitting operation.

As an example, the first sub-pixel 200 and the third sub-pixel 500 may start a light-emitting operation when a negative pulse is applied, and the second sub-pixel 300 and the fourth sub-pixel 600 may start a light-emitting operation when a positive pulse is applied. That is, blue and green light may be emitted by a negative pulse, and cyan and red light may be emitted by a positive pulse. Accordingly, it is possible to implement a pixel of the RGCB microdisplay, which is composed of a set of light sources of four colors of red (R), green (G), cyan (C), and blue (B) by controlling the input pulses.

Second Example Embodiment

Figure 4:
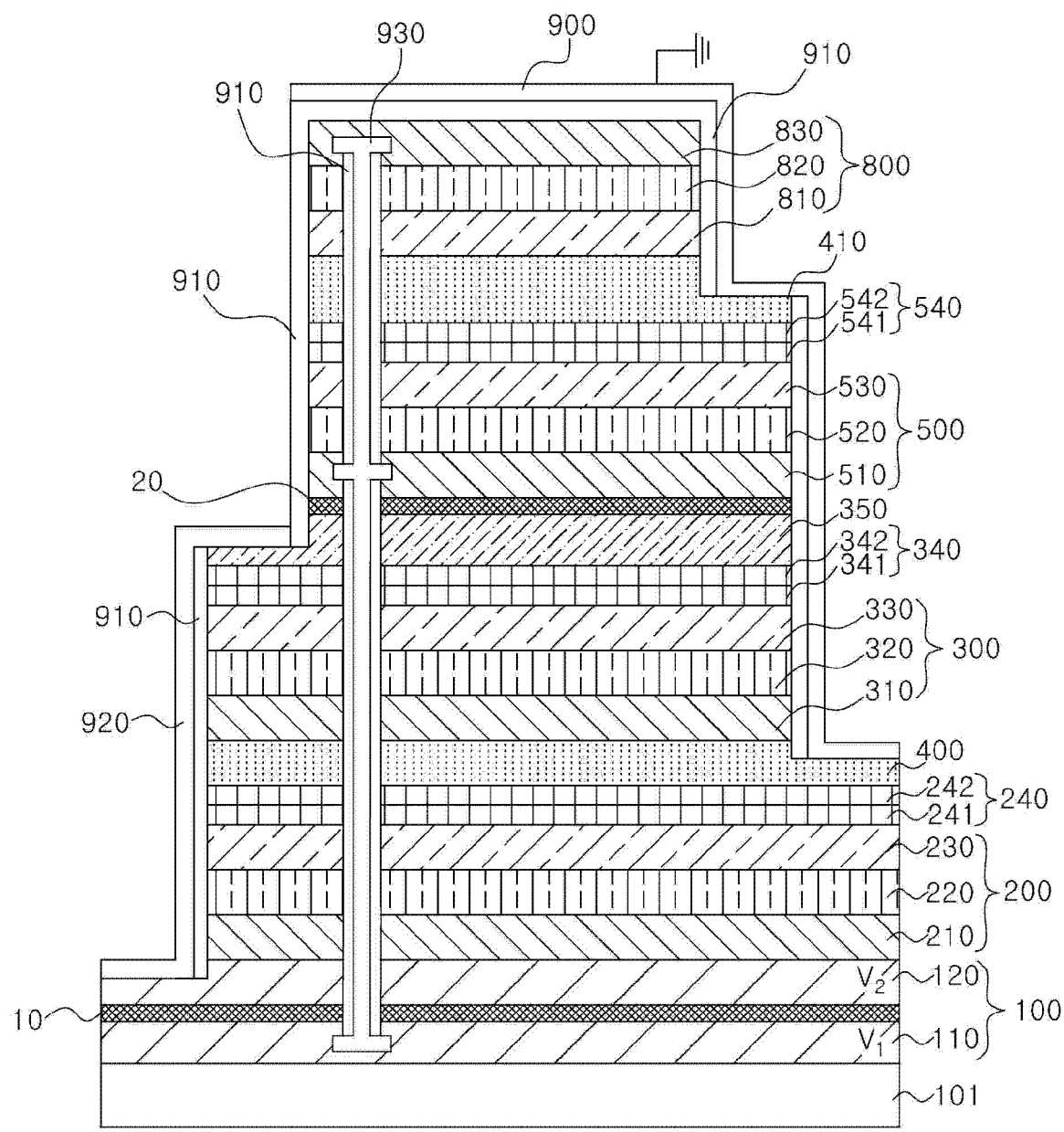
FIG. 4 is a schematic cross-sectional view of a pixel of an RGCB microdisplay according to a second example embodiment of the present inventive concept.

FIG. 4 is a schematic cross-sectional view of a pixel of an RGCB microdisplay according to a second example embodiment of the present inventive concept.

Referring to FIG. 4, a contact layer 100, a first sub-pixel 200, a second sub-pixel 300, a first common electrode layer 400, a third sub-pixel 500, and a fourth sub-pixel 800 are formed on a growth substrate 101. The contact layer 100, the first sub-pixel 200, the second sub-pixel 300, the first common electrode layer 400, and the third sub-pixel 500 are the same as described above with reference to FIG. 1. However, the arrangement and configuration of the fourth sub-pixel 800 are different from FIG. 1. Accordingly, the fourth sub-pixel 800 will be mainly described.

In the fourth sub-pixel 800, a fourth n-type semiconductor layer 810, a fourth active layer 820, and a fourth p-type semiconductor layer 830 are sequentially disposed. In addition, a second common electrode layer 410 may be formed between the third sub-pixel 500 and the fourth sub-pixel 800. That is, the second common electrode layer 410 and the fourth sub-pixel 800 may be sequentially formed on the third sub-pixel 500.

Each of the second common electrode layer 410 and the fourth n-type semiconductor layer 810 may be made of a GaN material, and Si is used as a dopant. In addition, the fourth p-type semiconductor layer 830 may be made of a GaN material, and Mg may be used as a dopant. The fourth active layer 820 may have a multi-quantum well structure and emit red light. Accordingly, the fourth active layer 820 of the fourth sub-pixel 800 may perform a light-emitting operation based on the GaN material by controlling the band gap that depends on changes in the fraction of In therein.

A common contact electrode layer 900 is formed on the fourth p-type semiconductor layer 830 and covers the fourth p-type semiconductor layer 830. In addition, the common contact electrode layer 900 may be connected to the ground. However, an insulating layer 910 is interposed between the common contact electrode layer 900 and the fourth p-type semiconductor layer 830 so that the common contact electrode layer 900 and the fourth p-type semiconductor layer 830 are insulated from each other. The common contact electrode layer 900 is made of a metal material and covers side surfaces of the second sub-pixel 300, the third sub-pixel 500, and the fourth sub-pixel 800. However, the insulating layer 910 is interposed between the common contact electrode layer 900 and the side surfaces of the second sub-pixel 300, the third sub-pixel 500, and the fourth sub-pixel 800 to prevent the common contact electrode layer 900 from being connected to the side surfaces of the other active layers.

Further, the common contact electrode layer 900 is also formed on a partially exposed surface of each of the third first common electrode layer 400 and the second common electrode layer 410. That is, the common contact electrode layer 900 is electrically connected to the first common electrode layer 400 which is commonly connected to the first sub-pixel 200 and the second sub-pixel 300 as well as the second common electrode layer 410 that is commonly connected to the third sub-pixel 500 and the fourth sub-pixel 800.

A first interconnect layer 920 is the same as described above with reference to FIG. 1. However, a second interconnect layer 930 may be formed on the fourth p-type semiconductor layer 830, a third n-type semiconductor layer 510, and a first n-type contact layer 110 exposed through etching or the like, and may extend from the fourth p-type semiconductor layer 830 beyond the fourth active layer 820 and the fourth n-type semiconductor layer 810 to the first n-type contact layer 110 so that the fourth p-type semiconductor layer 830, the third n-type semiconductor layer 510, and the first n-type contact layer 110 are electrically connected to each other. In addition, the extending portion of the second interconnect layer 930 may be electrically connected to other active layers and thus may be covered by the insulating layer 910.

Also, in the structure according to the second example embodiment, one common contact electrode layer 900 as well as the first interconnect layer 920 and the second interconnect layer 930 are formed. That is, the first sub-pixel 200 and the second sub-pixel 300 are connected to the common contact electrode layer 900 through the first common electrode layer 400, and the third sub-pixel 500 and the fourth sub-pixel 800 are connected to the common contact electrode layer 900 through the second common electrode layer 410. In addition, a first n-type semiconductor layer 210 of the first sub-pixel 200 and a first contact semiconductor layer 350 of the second sub-pixel 300 are connected to a second n-type contact layer 120, and the third n-type semiconductor layer 510 of the third sub-pixel 500 and the fourth p-type semiconductor layer 830 of the fourth sub-pixel 800 are connected to the first n-type contact layer 110. Accordingly, when a voltage difference is applied between the common contact electrode layer 900 and the separately formed contact electrode layers 110 and 120, each of the sub-pixels starts a light-emitting operation.

As described above, in the present example embodiment, four sub-pixels forming different wavelengths are stacked in a direction perpendicular to the growth substrate. In addition, one common contact electrode layer is formed in the sub-pixels, and currents are applied through n-type contact layers formed below the sub-pixels. Each of the sub-pixels performs a light-emitting operation due to the currents supplied independently of each other, and light formed in each of the sub-pixels is mixed to form a specific color.

In the present inventive concept, sub-pixels, which form light having different wavelengths, are vertically formed on a growth substrate. Thus, the area of a unit pixel of a microdisplay may be reduced. That is, the area of the unit pixel may be significantly reduced as compared to a conventional method in which sub-pixels are horizontally disposed on a display substrate and combined to form one pixel.

Further, in the present inventive concept, since four vertically stacked sub-pixels constitute one unit pixel, transfer processing is required only once. In addition, in the present inventive concept, since the sub-pixels are vertically disposed, mixing of colors is facilitated, and a display is very easily implemented as compared with the case in which sub-pixels are horizontally disposed.

Further, since a pixel of a microdisplay according to the present inventive concept is composed of a set of light sources of four colors of red (R), green (G), cyan (C), and blue (B), a richer color tone may be displayed by the pixel as compared with a conventional pixel using red (R), green (G), and blue (B) light.

Furthermore, manufacturing may be facilitated and the area of a unit pixel may be reduced due to forming a plurality of n-type contact layers connected to sub-pixels on a growth substrate and vertically forming the sub-pixels on the plurality of n-type contact layers, and the sub-pixels may be individually and independently controlled by forming a current blocking layer between the plurality of n-type contact layers.

According to the present inventive concept described above, sub-pixels which form light having different wavelengths are vertically formed on a growth substrate. Thus, the area of a unit pixel of a microdisplay can be reduced. That is, the area of the unit pixel can be significantly reduced as compared to a conventional method in which sub-pixels are horizontally disposed on a display substrate and combined to form one pixel.

Further, since the disadvantages of the conventional method in which multiple pixels of a display backplane must be used per unit pixel of a display when sub-pixels are disposed in the same plane can be overcome, higher resolution can be realized.

Further, since a unit pixel of a microdisplay according to the present inventive concept is composed of a set of light sources of four colors of red (R), green (G), cyan (C), and blue (B), a richer color tone can be display by the pixel as compared with a conventional unit pixel using red (R), green (G), and blue (B) light.

Further, manufacturing can be facilitated and the area of a unit pixel can be reduced due to forming a plurality of n-type contact layers connected to sub-pixels on a growth substrate and vertically forming four sub-pixels on the plurality of n-type contact layers, and the sub-pixels can be individually and independently controlled by forming a current blocking layer between the plurality of n-type contact layers.

It should be noted that technical implementations of the present inventive concept are not limited to those described above, and other technical implementations of the present inventive concept will be apparent to those skilled in the art from the following descriptions. Meanwhile, the example embodiments of the present inventive concept disclosed in the present specification and the drawings are only illustrative of specific examples for the purpose of understanding and are not intended to limit the scope of the present inventive concept. It will be apparent to those skilled in the art that other modifications based on the technical spirit of the present inventive concept are possible in addition to the example embodiments disclosed herein.

DESCRIPTION OF REFERENCE NUMERALS

10: first current blocking layer, 20: second current blocking layer
30: bonding layer, 100: contact semiconductor layer
101: growth substrate, 110: first n-type contact layer
120: second n-type contact layer, 200: first sub-pixel
210: first n-type semiconductor layer, 220: first active layer
230: first p-type semiconductor layer, 240: first tunnel junction layer 241, 341, and 541: p⁺⁺-GaN layers, 242, 342, and 542: n⁺⁺-GaN layers
300: second sub-pixel, 310: second n-type semiconductor layer
320: second active layer, 330: second p-type semiconductor layer
340: second tunnel junction layer, 350: first n-type contact semiconductor layer
400: first common electrode layer, 410: second common electrode layer
500: third sub-pixel, 510: third n-type semiconductor layer
520: third active layer, 530: third p-type semiconductor layer
540: third tunnel junction layer, 550: second n-type contact semiconductor layer
600 and 800: fourth sub-pixels, 610 and 830: fourth p-type semiconductor layers
620 and 820: fourth active layers, 630 and 810: fourth n-type semiconductor layers
700 and 900: common contact electrode layers, 710 and 910: insulating Layers
720 and 920: first interconnect layers, 730 and 930: second interconnect layers

What is claimed is:

1. A unit pixel of a Red-Green-Cyan-Blue (RGCB) microdisplay comprising:
a first n-type contact layer formed on a growth substrate;
a second n-type contact layer formed on the first n-type contact layer;
a first sub-pixel formed on the second n-type contact layer;
a second sub-pixel formed on the first sub-pixel;
a first common electrode layer formed between the first sub-pixel and the second sub-pixel;
a third sub-pixel formed on the second sub-pixel; and
a fourth sub-pixel formed on the third sub-pixel,
wherein the first sub-pixel and the second sub-pixel are connected to the second n-type contact layer, and
the third sub-pixel and the fourth sub-pixel are connected to the first n-type contact layer.

2. The unit pixel of claim 1, wherein
when a negative pulse is applied to the first n-type contact layer and the second n-type contact layer, the first sub-pixel and the third sub-pixel emit light, and
when a positive pulse is applied to the first n-type contact layer and the second n-type contact layer, the second sub-pixel and the fourth sub-pixel emit light.

3. The unit pixel of claim 1, wherein
the first sub-pixel forms light having a first wavelength,
the second sub-pixel forms light having a second wavelength longer than the first wavelength,
the third sub-pixel forms light having a third wavelength longer than the second wavelength, and
the fourth sub-pixel forms light having a fourth wavelength longer than the third wavelength.

4. The unit pixel of claim 3, wherein
the first wavelength forms blue (B) light,
the second wavelength forms cyan (C) light,
the third wavelength forms green (G) light, and
the fourth wavelength forms red (R) light.

5. The unit pixel of claim 1, further comprising:
a first current blocking layer formed between the first n-type contact layer and the second n-type contact layer; and
a second current blocking layer formed between the second sub-pixel and the third sub-pixel.

6. The unit pixel of claim 5, wherein the first current blocking layer and the second current blocking layer are each a p-type semiconductor or an insulating material.

7. The unit pixel of claim 5, further comprising:
a first n-type contact semiconductor layer formed between the second sub-pixel and the second current blocking layer; and
a second n-type contact semiconductor layer formed between the third sub-pixel and the fourth sub-pixel.

8. The unit pixel of claim 7, further comprising:
a first tunnel junction layer formed between the first common electrode layer and the first sub-pixel;
a second tunnel junction layer formed between the first n-type contact semiconductor layer and the second sub-pixel; and
a third tunnel junction layer formed between the second n-type contact semiconductor layer and the third sub-pixel.

9. The unit pixel of claim 7, further comprising a bonding layer formed between the second n-type contact semiconductor layer and the fourth sub-pixel.

10. The unit pixel of claim 7, wherein
the first sub-pixel includes a first n-type semiconductor layer, a first active layer, and a first p-type semiconductor layer which are sequentially stacked,
the second sub-pixel includes a second n-type semiconductor layer, a second active layer, and a second p-type semiconductor layer which are sequentially stacked,
the third sub-pixel includes a third n-type semiconductor layer, a third active layer, and a third p-type semiconductor layer which are sequentially stacked, and
the fourth sub-pixel includes a fourth p-type semiconductor layer, a fourth active layer, and a fourth n-type semiconductor layer which are sequentially stacked.

11. The unit pixel of claim 10, further comprising:
a first interconnect layer configured to electrically connect the second n-type contact layer and the first n-type contact semiconductor layer;
a second interconnect layer configured to electrically connect the first n-type contact layer, the third n-type semiconductor layer, and the fourth p-type semiconductor layer; and
a common contact electrode layer formed on an exposed surface of each of the first common electrode layer and the second n-type contact semiconductor layer and covering the fourth n-type semiconductor layer.

12. The unit pixel of claim 11, wherein
the first interconnect layer is formed on an exposed portion of each of the second n-type contact layer and the first n-type contact semiconductor layer,
the second interconnect layer is formed on an exposed portion of each of the fourth p-type semiconductor layer, the third n-type semiconductor layer, and the first n-type contact layer, and
the second interconnect layer is formed to extend from the fourth p-type semiconductor layer to the first n-type contact layer so that the fourth p-type semiconductor layer, the third n-type semiconductor layer, and the first n-type contact layer are electrically connected to each other.

13. The unit pixel of claim 10, wherein the fourth active layer includes AlInGaP.

14. The unit pixel of claim 5, further comprising:
a first n-type contact semiconductor layer formed between the second sub-pixel and the second current blocking layer; and a second common electrode layer formed between the third sub-pixel and the fourth sub-pixel.

15. The unit pixel of claim 14, further comprising:
a first n-type contact semiconductor layer formed between the second sub-pixel and the second current blocking layer; and
a second common electrode layer formed between the third sub-pixel and the fourth sub-pixel.

16. The unit pixel of claim 14, further comprising:
a first tunnel junction layer formed between the first common electrode layer and the first sub-pixel;
a second tunnel junction layer formed between the first n-type contact semiconductor layer and the second sub-pixel; and
a third tunnel junction layer formed between the second common electrode layer and the third sub-pixel.

17. The unit pixel of claim 14, wherein
the first sub-pixel includes a first n-type semiconductor layer, a first active layer, and a first p-type semiconductor layer which are sequentially stacked,
the second sub-pixel includes a second n-type semiconductor layer, a second active layer, and a second p-type semiconductor layer which are sequentially stacked,
the third sub-pixel includes a third n-type semiconductor layer, a third active layer, and a third p-type semiconductor layer which are sequentially stacked, and
the fourth sub-pixel includes a fourth n-type semiconductor layer, a fourth active layer, and a fourth p-type semiconductor layer which are sequentially stacked.

18. The unit pixel of claim 17, further comprising:
a first interconnect layer configured to electrically connect the second n-type contact layer and the first n-type contact semiconductor layer;
a second interconnect layer configured to electrically connect the first n-type contact layer, the third n-type semiconductor layer, and the fourth p-type semiconductor layer; and
a common contact electrode layer formed on an exposed surface of each of the first common electrode layer and the second common electrode layer and covering the fourth p-type semiconductor layer,
wherein the fourth p-type semiconductor layer and the common contact electrode layer are insulated from each other.

19. The unit pixel of claim 18, wherein
the first interconnect layer is formed on an exposed portion of each of the second n-type contact layer and the first n-type contact semiconductor layer,
the second interconnect layer is formed on an exposed portion of each of the fourth p-type semiconductor layer, the third n-type semiconductor layer, and the first n-type contact layer, and
the second interconnect layer is formed to extend from the fourth p-type semiconductor layer to the first n-type contact layer so that the fourth p-type semiconductor layer, the third n-type semiconductor layer, and the first n-type contact layer are electrically connected to each other.

* * * * *